United States Patent
Kobayashi et al.

(10) Patent No.: US 6,882,020 B2
(45) Date of Patent: Apr. 19, 2005

(54) CAMERA MODULE

(75) Inventors: Kenichi Kobayashi, Gunma (JP); Hiroyuki Tamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 25 days.

(21) Appl. No.: 10/655,274

(22) Filed: Sep. 4, 2003

(65) Prior Publication Data

US 2004/0080642 A1 Apr. 29, 2004

(30) Foreign Application Priority Data

Sep. 27, 2002 (JP) ..................................... P.2002-284031

(51) Int. Cl.$^7$ .......................................... H01L 31/0203
(52) U.S. Cl. ...................................... 257/433; 257/431
(58) Field of Search ................................ 257/431, 432, 257/433, 434, 435, 436, 437, 443, 444, 459, 734, 777

(56) References Cited

U.S. PATENT DOCUMENTS 6,297,540 B1 * 10/2001 Assadi et al.

* cited by examiner

Primary Examiner—Nathan J. Flynn
Assistant Examiner—Kevin Quinto
(74) Attorney, Agent, or Firm—Fish & Richardson P.C.

(57) ABSTRACT

A small, thin camera module is provided in which a chipset made up of the image pickup element (13), etc., is sealed with the transparent resin (15) wherein a camera module (10) is made up of a conductive pattern (11); a signal processing element (12) having a surface on which an element is formed and which is shielded from light by being mounted facedown on the conductive pattern (11); an image pickup element (13) fixed onto the signal processing element (12); a thin metal wire (16) by which an electrical connection is established between the image pickup element (13) and the conductive pattern (11); a transparent resin (15) with which the signal processing element (12), the image pickup element (13), and the thin metal wire (16) are covered; and a lens (24) situated above the image pickup element (13).

8 Claims, 9 Drawing Sheets

CAMERA MODULE

BACKGROUND OF THE INVENTION

1. Field of the Invention

The present invention pertains to a camera module and, more particularly, to a camera module reduced in thickness and in weight by forming an image pickup element and a signal processing element so as to have a stack structure.

2. Description of the Related Art

In recent years, camera modules have been positively employed for cellular telephones, portable computers, etc. Therefore, camera modules are required to be reduced in size, in thickness, and in weight.

In the present invention, as an example, a description will be given referring to a camera module that uses a CCD as a semiconductor image pickup element. Semiconductor image pickup elements (a CMOS sensor, for example) other than the CCD can be used.

A description will be given of the structure of a conventional camera module with reference to FIG. 17. First, a CCD102 is mounted on a mounting board 101. A lens 105 used to converge light from the outside is fixed to a lens barrel 106 above the CCD102. The lens barrel 106 is held by a lens holder 107, and the lens holder 107 is mounted on the mounting board 101 by means of a lens-fastening screw 108 (see patent Publication 1 mentioned below, for example).

The CCD, which is an abbreviation for Charge Coupled Device, functions to output an electric charge proportional to the intensity of light converged by the lens 105. The lens barrel 106 has its side face like a screw (not shown), and functions to focus the lens 105 by being rotated.

A chip component 103 and a reverse-side chip component 104 are mounted on the obverse face and the reverse face, respectively, of the mounting board 101. DSPs, driver ICs, capacitors, resistors and diodes can be adapted as these chip components. The DSP, which is an abbreviation for Digital Signal Processor, functions to process digital signals sent from the CCD at high speed. The driver IC functions to pressurize a driving signal sent from the DSP and transfers an electric charge stored in the CCD, in order to drive the CCD.

A description will be given of a method for assembling this camera module with reference to FIG. 18. Referring first to FIG. 18(A), the mounting board 101 is prepared, and the reverse-side chip component 104 is mounted on the reverse face of the mounting board 101.

Referring next to FIG. 18(B), the CCD 102 and the chip component 103 are mounted on the obverse face of the mounting board 101.

Finally, referring to FIG. 18(C), the lens barrel 106 to which the lens 105 is fixed is fixed to the lens holder 107, and the lens holder 107 is fixed to the mounting board 101 by means of the lens-fastening screw 108. In order to fix the lens holder 107 by means of the lens-fastening screw 108, a through hole is formed in a corresponding part. A conventional camera module using the mounting board 101 is completed according to this method.

Patent Publication 1: Japanese Unexamined Patent Publication No. 2002-185827 (Page 4, FIG. 2)

However, the conventional camera module has had the following problems.

Since the elements, such as the DSP and the driver IC, that are used to process the signal of the CCD 102 and to drive it are flatly mounted on the mounting board 101, the mounting board 101 is required to have a large area, and this has hindered size reduction of the camera module.

Additionally, the mounting board 101 is inherently unnecessary. However, in terms of a manufacturing method, the mounting board 101 has been used to stick electrodes together and to fix the lens holder 107. Therefore, the mounting board 101 could not be eliminated.

SUMMARY OF THE INVENTION

The present invention has been made in consideration of the aforementioned problems, and a primary object of the present invention is to provide a camera module reduced in size and in thickness by forming an image pickup element, such as a CCD, and an element used to perform its signal processing so as to have a stack structure.

First, the present invention is characterized by having a conductive pattern; a signal processing element having a surface on which an element is formed, the surface being shielded from light by being mounted facedown on the conductive pattern; an image pickup element fixed onto the signal processing element; a thin metal wire by which an electrical connection is established between the image pickup element and the conductive pattern; a transparent resin with which the signal processing element, the image pickup element, and the thin metal wire are covered; and a lens situated above the image pickup element.

Second, the present invention is characterized in that an optically opaque underfill resin is applied between the signal processing element and the conductive pattern.

Third, the present invention is characterized in that the image pickup element is a CCD or a CMOS.

Fourth, the present invention is characterized in that the signal processing element is an element used to drive the image pickup element and to process signals of the image pickup element.

Fifth, the present invention is characterized in that chip components, such as a chip capacitor and a chip resistor, are mounted on the conductive pattern around the signal processing element.

Sixth, the present invention is characterized in that the conductive pattern forms a single-layered wiring structure, and a reverse face of the conductive pattern is exposed from the insulating resin.

Seventh, the present invention is characterized in that the conductive pattern forms a multi-layered wiring structure.

Eighth, the present invention is characterized in that a side face and an upper face of the transparent resin are protected by a holder to an upper part of which the lens is fixed.

DETAILED DESCRIPTION OF THE PREFERRED EMBODIMENTS (First Embodiment that Describes the Structure of a Camera Module)

Figure 1A:
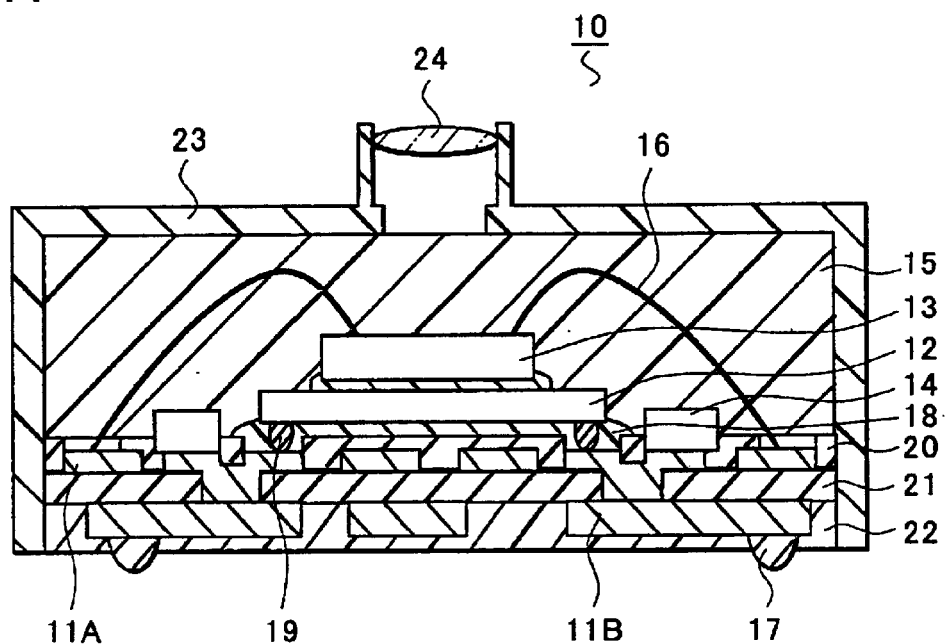
FIG. 1 is a sectional view (A) and a plan view (B) explaining the camera module of the present invention.
Figure 1B:
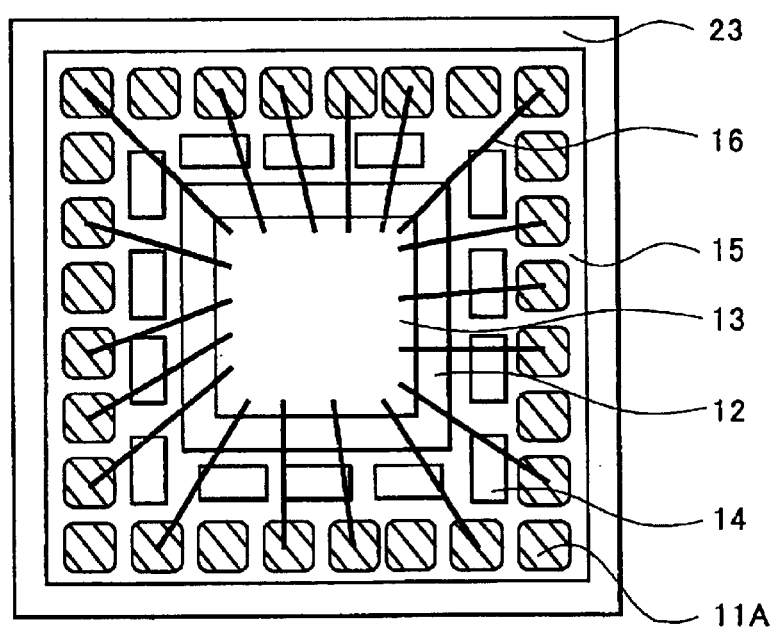

A camera module 10 of the present invention will be described with reference to FIG. 1. FIG. 1(A) is a sectional view of the camera module 10, and FIG. 1(B) is a plan view thereof.

The camera module 10 is made up of a conductive pattern 11; a signal processing element 12 having a surface on which an element is formed and which is shielded from light by being mounted facedown on the conductive pattern; an image pickup element 13 fixed onto the signal processing element 12; a thin metal wire 16 by which an electrical connection is established between the image pickup element 13 and the conductive pattern 11; a transparent resin 15 with which the signal processing element 12, the image pickup element 13, and the thin metal wire 16 are covered; and a lens 24 situated above the image pickup element 13.

Referring to FIG. 1(A), the conductive pattern 11 consists of a first conductive pattern 11A and a second conductive pattern 11B that are insulated by an insulating layer 21, and has a multi-layered wiring structure. The first conductive pattern 11A is formed on the insulating layer 21, and the signal processing element 12 and a chip component 14 are mounted on the first conductive pattern 11A. The first conductive pattern 11A further forms a bonding pad in addition to the wiring part, and is electrically connected to the image pickup element 13 through the thin metal wire 16. The second conductive pattern 11B is formed under the insulating layer 21, and an external electrode 17 is formed on the reverse face of camera module. A through-hole is formed in a desired part of the insulating layer 21, and the first conductive pattern 11A and the second conductive pattern 11B are electrically connected to each other by subjecting this through-hole to plating or the like. Furthermore, the first conductive pattern 11A and the second conductive pattern 11B are covered with an overcoat resin 20, and the overcoat resin 20 is partially removed at places where circuit elements or electrodes are formed. Although the conductive pattern 11 has a two-layered wiring structure in this example, it can have a wiring structure of three or more layers.

The signal processing element 12, whose surface on which a circuit element is formed is directed downward, is mounted facedown on the first conductive pattern 11A. Since the signal processing element 12 is mounted facedown, and the surface on which the element is formed is directed toward the conductive pattern 11, it is possible to prevent a malfunction caused by allowing light that has intruded from the outside to enter the element. An electric connection between the signal processing element 12 and the first conductive pattern 11A is performed by a bump electrode 19. The bump electrode 19 is formed with a conductive paste, such as a solder ball. A gap between the signal processing element 12 and the first conductive pattern 11A that have been mounted by flip chip bonding is filled with an optically opaque underfill resin 18. The surface of the signal processing element 12 can be reliably shielded from light by fully applying the optically opaque underfill resin 18 in this way. A driver used to drive the image pickup element 13 and a DSP used to process an electric signal of the image pickup element 13 are formed on the surface of the signal processing element 12, and these functions are built into one element. Herein, a DSP chip that constitutes the DSP and a driver chip that constitutes the driver circuit can be individually formed, and the image pickup element can be mounted on either of the elements in stack-structure form.

The image pickup element 13 is fixed faceup onto the signal processing element 12 with an insulating adhesive or the like, and is electrically connected to the first conductive pattern 11A through the thin metal wire 16. A CCD element or a CMOS element can be employed as the signal processing element 12. Since the signal processing element 12 is sealed with a transparent resin, and the lens 24 is firmly placed thereabove, light condensed by the lens 24 passes through the transparent resin 15 and reaches a light-receiving surface of the signal processing element 12.

The transparent resin 15 is made of a light-transmissible resin, and functions to seal the circuit element and the thin metal wire mounted on the conductive pattern 11. In further detail, the transparent resin 15 seals the signal processing element 12, the image pickup element 13, the chip component 14, and the thin metal wire 16. A thermosetting resin formed by transfer molding or a thermoplastic resin formed by injection molding can be employed as a material of the transparent resin 15.

The chip component 14 is, for example, a chip capacitor or a chip resistor used to reduce noise, and is fixed to the first conductive pattern 11A with a brazing material such as a solder. In FIG. 1(B), a bonding pad made up of the first conductive patterns is formed at a peripheral part, and the chip components 14 are firmly placed thereinside, but, instead, the chip components 14 can be fixed to the first conductive patterns 11A situated at other places.

A holder 23 has a shape to cover the exterior of the transparent resin 15, and the lens 24 is disposed at a corresponding position above the light receiving part of the signal processing element 12. Additionally, an opening through which light passes is provided under the lens. Noise except for light condensed by the lens 24 can be prevented from intruding into the transparent resin by covering the transparent resin 15 with the holder 23 in this way.

The present invention is characterized in that a chipset of the image pickup elements 13 and the other elements that constitute a camera module are sealed with the transparent resin 15, and the signal processing element 12 is mounted facedown, and, accordingly, light is prevented from entering the surface of the signal processing element 12. Concretely, in order to allow light condensed by the lens 24 to reach the light receiving surface of the image pickup element 13 that has been sealed, the transparent resin 15 is employed as a sealing resin in the present invention. However, if light enters upon the surface of the signal processing element 12 having a circuit made up of a plurality of transistors, or the like, the circuit will be in danger of causing a malfunction. Therefore, in the present invention, the surface of the signal processing element 12 is shielded from light by mounting the signal processing element 12 facedown on the first conductive pattern 11A. Furthermore, a gap between the surface of the signal processing element 12 and the first conductive pattern 11A is filled with the underfill resin 18 made of an optically opaque material. Thus, an effect by which the surface of the signal processing element 12 is shielded from light can be heightened.

The present invention is further characterized in that the image pickup element 13 is mounted on the signal processing element 12 mounted facedown. The image pickup element 13 is electrically connected to the first conductive pattern through the thin metal wire 16, and the image pickup element 13 and the signal processing element 12 are electrically connected to each other through the thin metal wire 13 and the conductive pattern 11. Thus, the whole of the camera module can be reduced in size by forming the image pickup element 13 so as to have a stack structure.

Figure 2A:
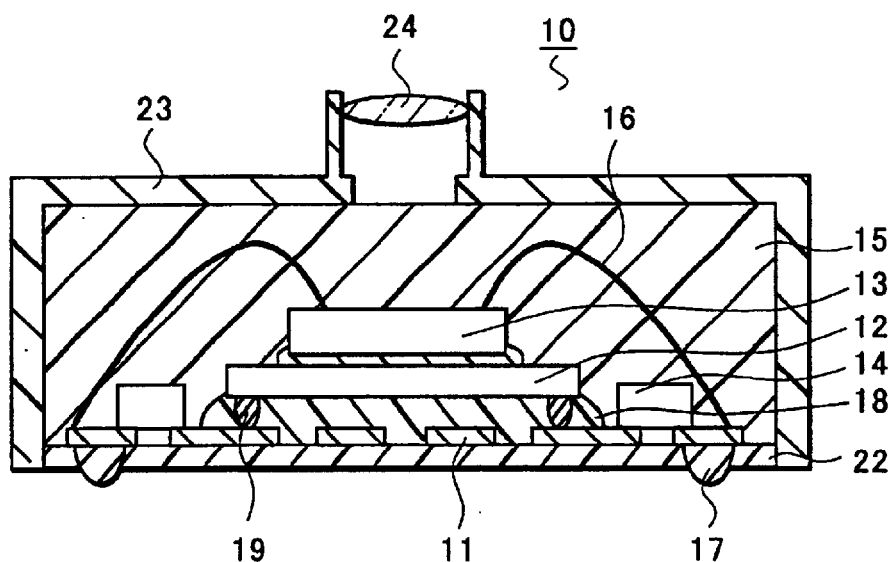
FIG. 2 is a sectional view (A) and a plan view (B) explaining the camera module of the present invention.
Figure 2B:
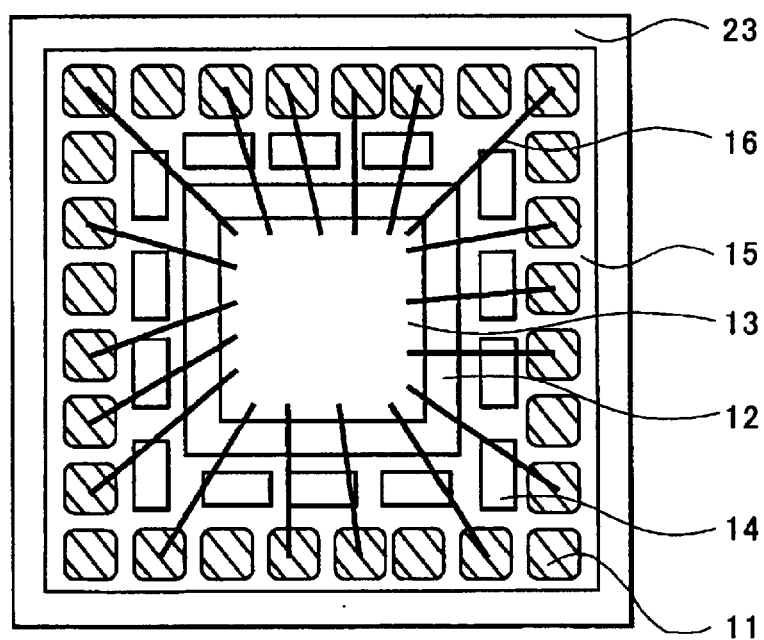

The structure of a camera module 10A according to another embodiment will be described with reference to FIG. 2. Referring to FIG. 2, the camera module 10A is made up of a conductive pattern 11 forming a single-layered wiring structure; a signal processing element 12 having a surface on which an element is formed and which is shielded from light by being mounted facedown on the conductive pattern 11; an image pickup element 13 fixed onto the signal processing element 12; a thin metal wire 16 by which an electrical connection is established between the image pickup element 13 and the conductive pattern 11; a transparent resin 15 with which the signal processing element 12, the image pickup element 13, and the thin metal wire 16 are covered; and a lens 24 situated above the image pickup element 13.

As mentioned above, the structure of the camera module 10A is similar to that of the camera module 10 described with reference to FIG. 1, but is different in the structure of the conductive pattern 11. In the camera module 10A, the conductive pattern 11 has a single-layered wiring structure, and is sealed with the transparent resin 15 while exposing the reverse face thereof. Therefore, an external electrode is formed at a desired part of the reverse face of the conductive pattern 11. Furthermore, the reverse face of the exposed conductive pattern 11 is covered with an overcoat resin 22, and, herein, the overcoat resin 22 is made of an optically opaque material. Thus, light can be prevented from entering from the undersurface of the camera module 10A.

Furthermore, although the conductive pattern 11 is embedded in the resin while exposing the reverse face thereof according to the aforementioned description, the conductive pattern 11 can be formed on the obverse face of or on both the obverse and reverse faces of a supporting board, such as a glass epoxy board.

(Second Embodiment that Describes a Method for Manufacturing a Camera Module)

Referring to FIG. 3 through FIG. 9, a description will now be given of a method for manufacturing the camera module 10 whose structure has been described with reference to FIG. 1.

The camera module 10 is manufactured through a step of forming the conductive pattern 11 that forms a multi-layered wiring structure, a step of fixing the signal processing element 12 facedown and fixing the chip component 14 onto the first conductive pattern 11A, a step of fixing the image pickup element 13 onto the signal processing element 12 and electrically fixing the signal processing element 12 and the first conductive pattern 11A to each other with a thin metal wire, a step of sealing the image pickup element 13, etc., with a transparent resin, and a step of fitting the holder 23 onto the transparent resin 15. Each of these steps will be hereinafter described.

Figure 3:
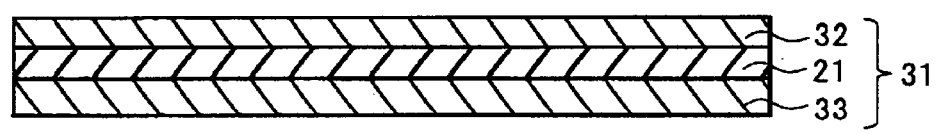
FIG. 3 is a sectional view explaining a method for manufacturing the camera module of the present invention.

Referring to FIG. 3, an insulating sheet 31 is prepared consisting of a first conductive film 32 and a second conductive film 33 stacked one above the other with an insulating layer 21 therebetween. Since the first conductive film 32 forms a fine conductive pattern on which the signal processing element 12, etc., are mounted, the first conductive film 32 is made thin, and, since the second conductive film 33 functions to mechanically support the insulating sheet 31, the second conductive film 33 is made thick from the viewpoint of strength.

Figure 4:
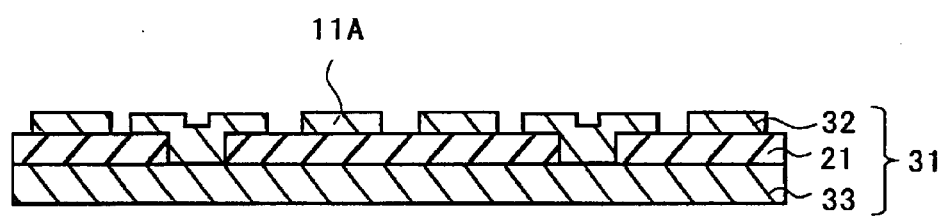
FIG. 4 is a sectional view explaining a method for manufacturing the camera module of the present invention.

Referring to FIG. 4, the first conductive pattern 11A is formed by selectively etching the first conductive film 32. Furthermore, a through-hole is formed by removing the first conductive pattern 11A, which is situated at a desired place, and the insulating layer 21 thereunder, and a plating film is applied to this place, whereby an electrical connection is established between the first conductive pattern 11A and the second conductive film 33.

Figure 5:
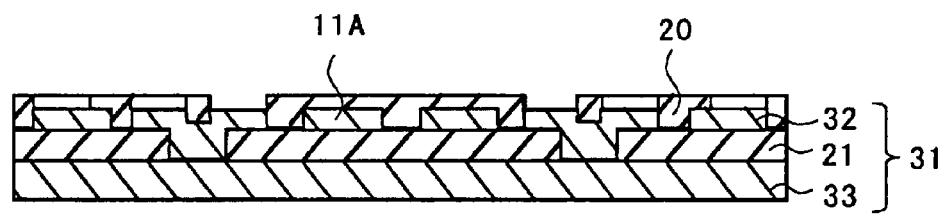
FIG. 5 is a sectional view explaining a method for manufacturing the camera module of the present invention.

Referring to FIG. 5, the first conductive pattern 11A is covered with the overcoat resin 20. Furthermore, the overcoat resin 20 is partially removed so as to expose the first conductive patterns 11A to which the thin metal wire 16 is bonded and on which the IC, etc., are mounted.

Figure 6:
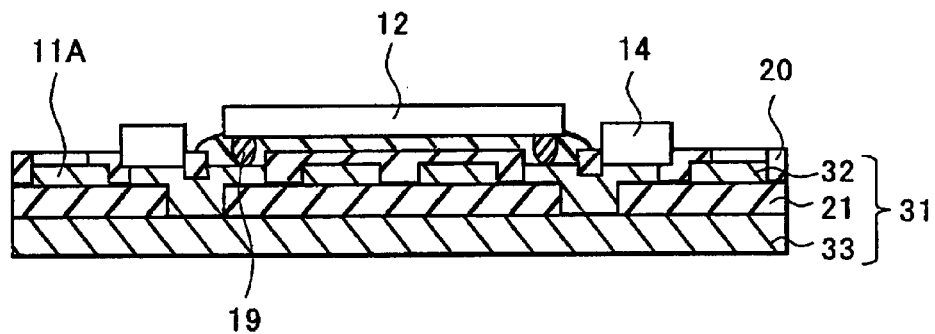
FIG. 6 is a sectional view explaining a method for manufacturing the camera module of the present invention.

Referring to FIG. 6, the signal processing element 12 and the chip component 14 are mounted. The signal processing element 12 is mounted facedown on the first conductive pattern 11A, and is connected thereto through the bump electrode 19 made of a brazing material. The chip components 14, which are a chip resistor, a chip capacitor, etc., are fixed onto the first conductive pattern 11A through a brazing material. A gap between the signal processing element 12 mounted facedown and the conductive pattern 11A is filled with the optically opaque underfill resin 18.

Figure 7:
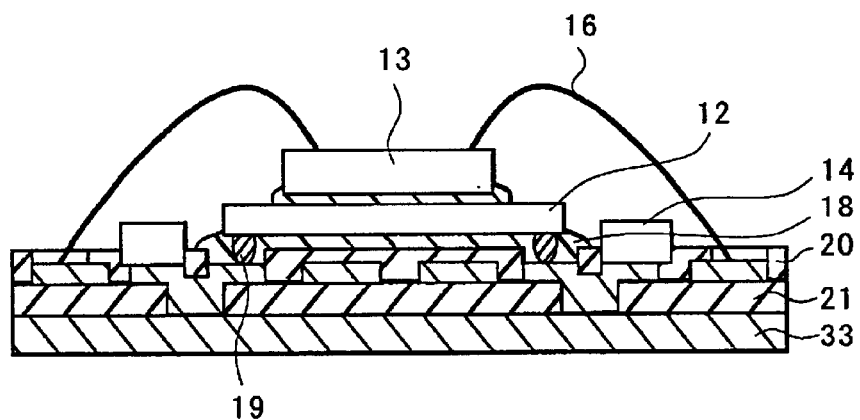
FIG. 7 is a sectional view explaining a method for manufacturing the camera module of the present invention.

Referring to FIG. 7, the image pickup element 13 is mounted faceup on the upper face of the signal processing element 12 mounted by flip chip bonding through an insulating adhesive. A light-receiving surface having a CCD element or a CMOS element is formed on the upper face of the image pickup element 13, and the electrode of the image pickup element 13 and the first conductive pattern 11A are electrically connected to each other through the thin metal wire 16.

Figure 8:
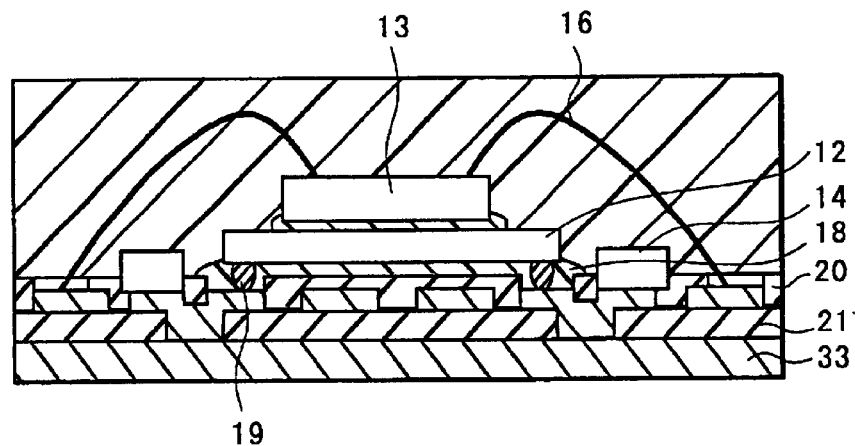
FIG. 8 is a sectional view explaining a method for manufacturing the camera module of the present invention.

Referring to FIG. 8, the image pickup element 13, etc., which are mounted on the first conductive pattern 11A, are sealed with the transparent resin 15 so as to be covered. This sealing can be performed by transfer molding that uses a thermosetting resin or by injection molding that uses a thermoplastic resin. Thus, light from the outside can be allowed to enter the light receiving surface of the image pickup element 13 by being sealed with the transparent resin 15.

Figure 9:
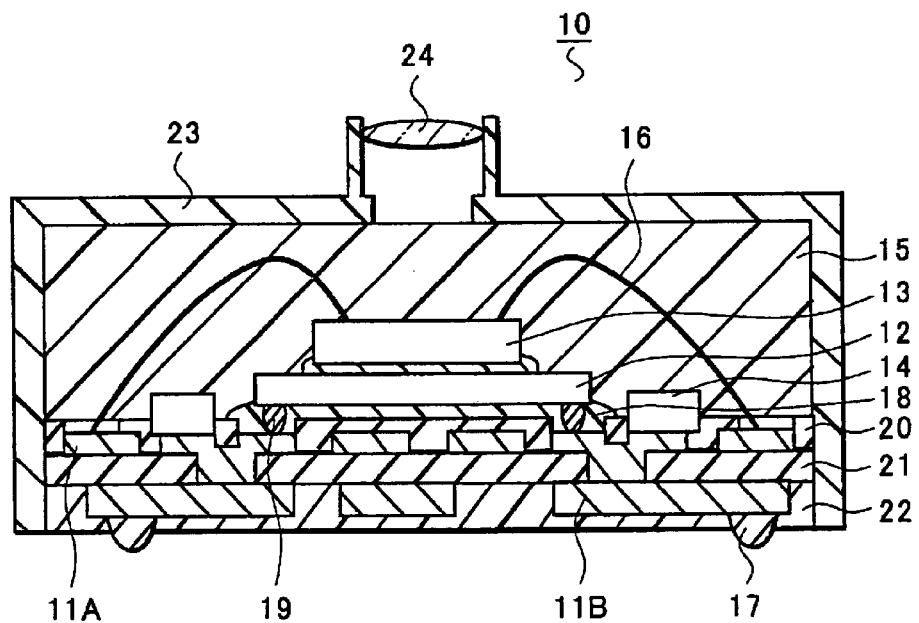
FIG. 9 is a sectional view explaining a method for manufacturing the camera module of the present invention.

Referring to FIG. 9, a second conductive pattern 11B is formed by partially removing the second conductive film 33. Furthermore, after the second conductive pattern 11B is covered with the overcoat resin 22, the external electrode 17 is formed. Last, the holder 23 is fitted onto the transparent resin 15 so that the transparent resin 15 is covered therewith.

The holder 23 has the lens 24 fixed to a part above the light receiving surface of the image pickup element 13.

(Third Embodiment that Describes a Method for Manufacturing a Camera Module)

In this Embodiment, referring to FIG. 10 through FIG. 16, a description will be given of a method for manufacturing the camera module 10A that has the single-layered wiring structure shown in FIG. 2. This method for manufacturing the camera module 10A has a step of preparing a conductive foil 40 and forming a separation groove 41 in a part excluding the area of the conductive pattern 11, a step of mounting the signal processing element 12 and the chip component 14 facedown on the conductive pattern 11, a step of fixing the image pickup element onto the signal processing element 12 and establishing an electrical connection between the image pickup element 13 and the conductive pattern 11, a step of sealing the image pickup element 13, etc., with the transparent resin 15, a step of removing the reverse face of the conductive foil 40 and thereby electrically separating the conductive pattern 11, and a step of fitting the holder 23 onto the transparent resin 15. Each of these steps will be hereinafter described.

Figure 10:
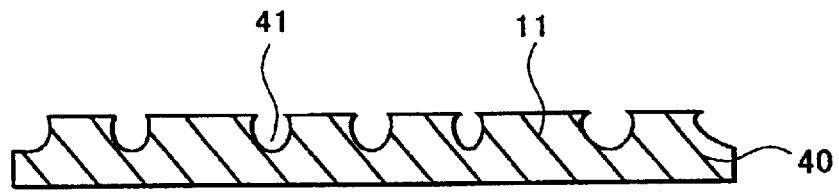
FIG. 10 is a sectional view explaining a method for manufacturing the camera module of the present invention.

Referring to FIG. 10, the conductive foil 40 is prepared, and the separation groove 41 whose depth is shallower than the thickness of the conductive foil 40 is formed in a part excluding an area where the conductive pattern 11 is formed. This separation groove 41 can be formed by performing selective etching by use of a mask such as an etching resist. The side face of the separation groove partially removed by the etching is curved.

Figure 11:
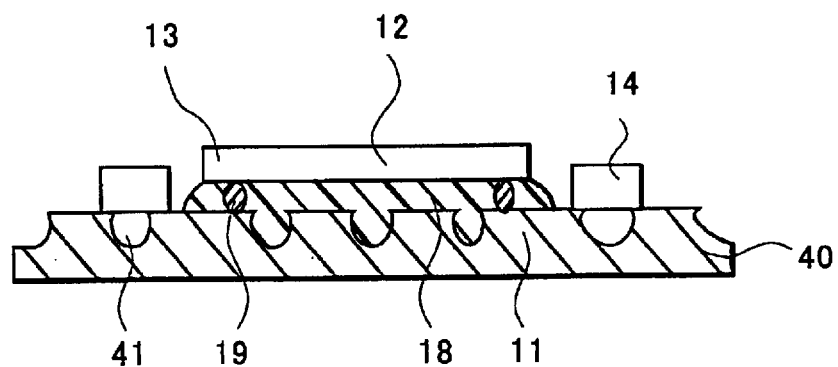
FIG. 11 is a sectional view explaining a method for manufacturing the camera module of the present invention.

Referring to FIG. 11, the signal processing element 12 and the chip component 14 are mounted. The signal processing element 12 is mounted facedown on the conductive pattern 11, and is connected thereto through the bump electrode 19 made of a brazing material. The chip components 14, which are a chip resistor, a chip capacitor, etc., are fixed onto the conductive pattern 11 through a brazing material. A gap between the signal processing element 12 mounted facedown and the conductive pattern 11 is filled with the underfill resin 18.

Figure 12:
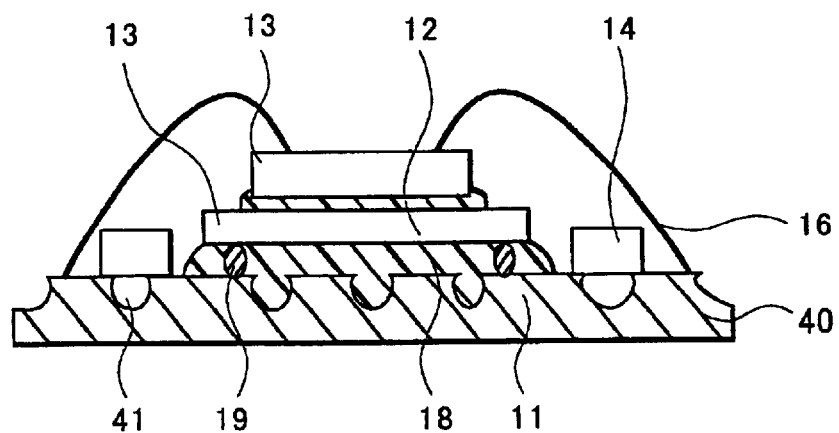
FIG. 12 is a sectional view explaining a method for manufacturing the camera module of the present invention.

Referring to FIG. 12, the image pickup element 13 is mounted faceup on the upper face of the signal processing element 12 mounted by flip chip bonding through an insulating adhesive. A light-receiving surface having a CCD element or a CMOS element is formed on the upper face of the image pickup element 13, and the electrode of the image pickup element 13 and the first conductive pattern 11A are electrically connected to each other through the thin metal wire 16.

Figure 13:
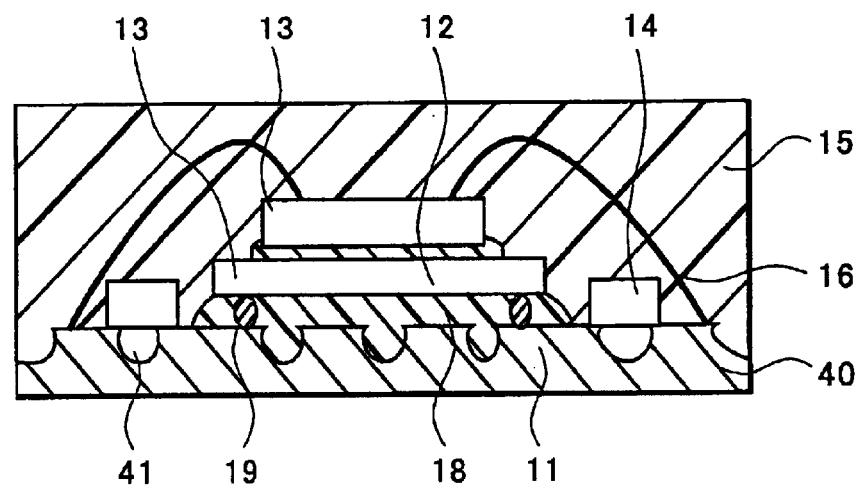
FIG. 13 is a sectional view explaining a method for manufacturing the camera module of the present invention.

Referring to FIG. 13, the signal processing element 12, etc., which are mounted on the first conductive pattern 11A, are sealed with the transparent resin 15 so as to be covered. This sealing can be performed by transfer molding that uses a thermosetting resin or by injection molding that uses a thermoplastic resin. Thus, light from the outside can be allowed to enter upon the light receiving surface of the image pickup element 13 by being sealed with the transparent resin 15.

Figure 14:
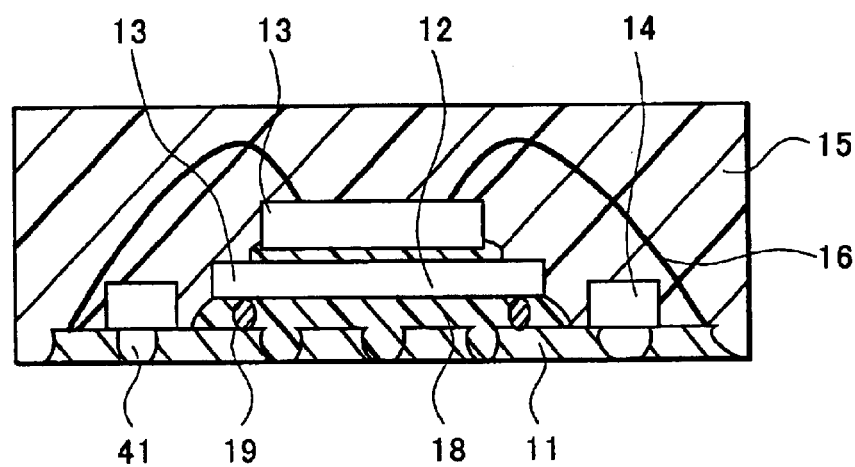
FIG. 14 is a sectional view explaining a method for manufacturing the camera module of the present invention.
Figure 15:
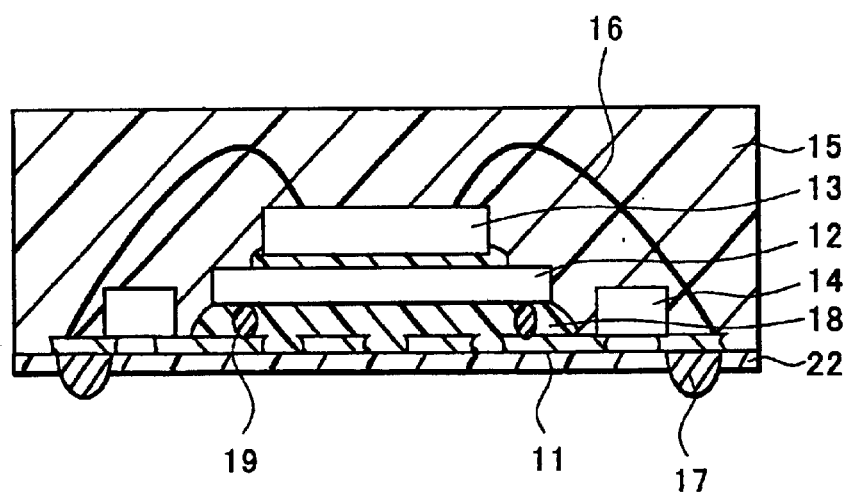
FIG. 15 is a sectional view explaining a method for manufacturing the camera module of the present invention.

Referring to FIG. 14 and FIG. 15, the conductive pattern 11 is electrically separated by wholly etching the reverse face of the conductive foil 40. Accordingly, the reverse face of the conductive pattern 11 has a structure exposed from the transparent resin 15. The conductive pattern 11 whose reverse face is exposed is further covered with the overcoat resin 22 so as to protect the reverse face. The overcoat resin 20 is an optically opaque resin, and the conductive pattern 11 exposed toward the reverse side and the transparent resin 15 are covered with this resin. Therefore, light can be prevented from entering from the reverse side to the transparent resin 15. The external electrode 17 made of a brazing material, or the like, is formed at a desired part of the reverse face of the conductive pattern 11.

Figure 16:
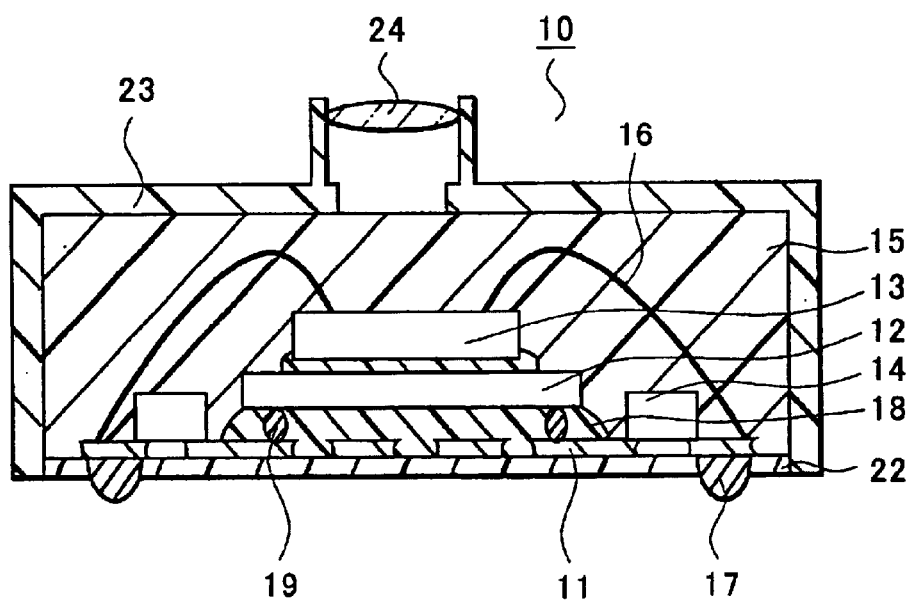
FIG. 16 is a sectional view explaining a method for manufacturing the camera module of the present invention.
Figure 17:
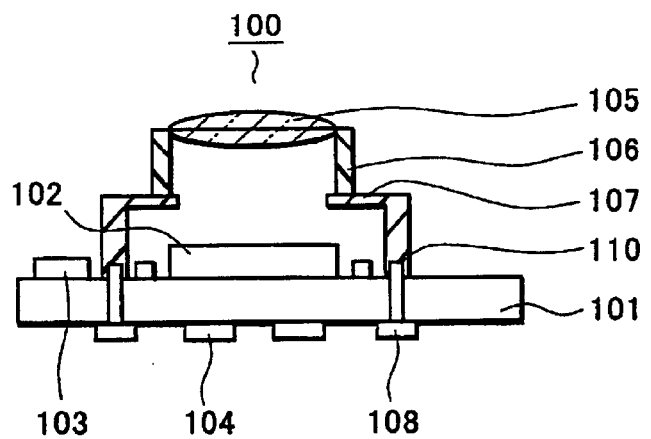
FIG. 17 is a sectional view explaining a conventional camera module.
Figure 18A:
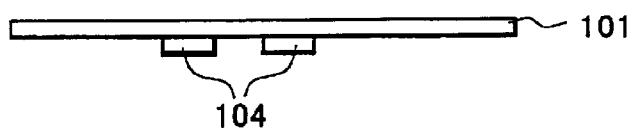
FIG. 18 is a view explaining a method for manufacturing the conventional camera module.
Figure 18B:
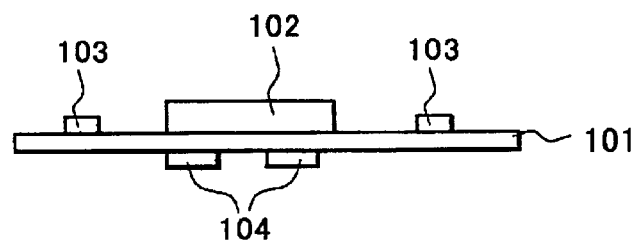
Figure 18C:
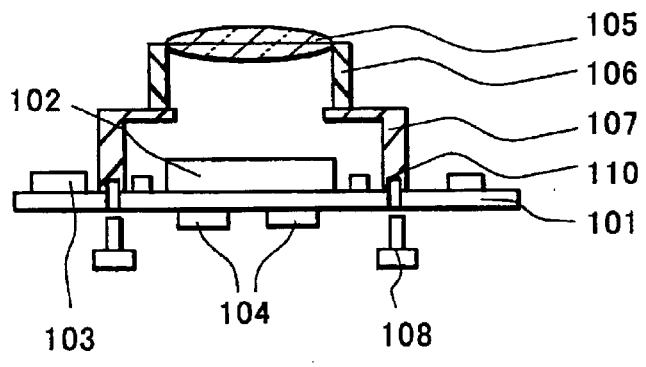

Referring to FIG. 16, the holder 23 is fitted onto the transparent resin 15 so that the transparent resin 15 is covered therewith. The holder 23 has the lens 24 fixed to a part above the light receiving surface of the image pickup element 13.

The following advantageous effects can be achieved according to the camera module of the present invention.

First, since the image pickup element 13 is fixed onto the signal processing element 12 mounted facedown in stack-structure form, it is possible to reduce an area needed to mount a chipset that constitutes the camera module.

Second, since the signal processing element 12 is mounted facedown, and since a gap between the signal processing element 12 and the conductive pattern 11 is filled with the underfill resin 18, the surface of the signal processing element 12 can be shielded from light. Therefore, the signal processing element 12 can be prevented from bringing about a malfunction that is caused by light which entered the transparent resin 15.

Third, since the camera module of the present invention is formed without a mounting board like a glass epoxy board, the camera module of the present invention is smaller in weight and in thickness than the conventional camera module.

Fourth, in the conventional camera module, a light-blocking plate has been used to prevent incident light from striking a part excluding the light-receiving surface of the image pickup element. However, in the present invention, the signal processing element 12 is mounted facedown, and therefore the camera module can be formed without such a light-blocking plate.

What is claimed is:

1. A camera module comprising:

a conductive pattern;

a signal processing element mounted facedown on said conductive pattern;

an image pickup element fixed onto said signal processing element;

a thin metal wire electrically connecting said image pickup element and said conductive pattern;

a transparent resin with which said signal processing element, said image pickup element, and said thin metal wire are covered; and a lens situated above the image pickup element.

2. The camera module as set forth in claim 1, wherein an optically opaque underfill resin is applied between said signal processing element and said conductive pattern.

3. The camera module as set forth in claim 1, wherein said image pickup element is a CCD or a CMOS.

4. The camera module as set forth in claim 1, wherein said signal processing element is an element used to drive said image pickup element and to process signals of said image pickup element.

5. The camera module as set forth in claim 1, wherein chip components including a chip capacitor and a chip resistor are mounted on said conductive pattern around said signal processing element.

6. The camera module as set forth in claim 1, wherein said conductive pattern forms a single-layered structure, and a reverse face of said conductive pattern is exposed from said insulating resin.

7. The camera module as set forth in claim 1, wherein said conductive pattern forms a multi-layered structure.

8. The camera module as set forth in claim 1, wherein a side face and an upper face of said transparent resin are protected by a holder to an upper part of which the lens is fixed.

* * * * *